United States Patent [19]

Berglund

[11] 4,040,063
[45] Aug. 2, 1977

[54] RECORDING DEVICE FOR PLOTTING THE CURVE OF AT LEAST ONE MEASURED QUANTITY

[75] Inventor: Kurt Karl Henrik Alexander Berglund, Solna, Sweden

[73] Assignee: Siemens Aktiengesellschaft, Berlin & Munich, Germany

[21] Appl. No.: 596,084

[22] Filed: July 15, 1975

[30] Foreign Application Priority Data

July 19, 1974 Germany ............................ 2434963

[51] Int. Cl.² ............................................ G01D 9/34
[52] U.S. Cl. ....................................... 346/23; 346/34; 346/62
[58] Field of Search ................. 346/23, 62, 34, 110 R

[56] References Cited

U.S. PATENT DOCUMENTS

| 2,596,118 | 5/1952 | Bischoff et al. ............ | 346/23 X |
| 2,768,050 | 10/1956 | Alden .................. | 346/62 X |
| 3,518,696 | 6/1970 | Tomota et al. ............ | 346/23 |
| 3,596,281 | 7/1971 | Lombardi .............. | 346/34 |

*Primary Examiner*—Joseph W. Hartary
*Attorney, Agent, or Firm*—Hill, Gross, Simpson, Van Santen, Steadman, Chiara & Simpson

[57] ABSTRACT

A recording device for plotting the curve of at least one measured quantity which is reproduced through an electrical signal, including a recorder, a recording or graph carrier, and means for producing relative movement between the recorder and the recording carrier into two directions extending approximately perpendicularly to each other. A time multiplexer alternatingly periodically connects the control input of the recording device to a generator for a reference line signal and to at least one generator for a measured quantity signal. In a suitable construction of the invention, it is proposed that to the particular input of the multiplexer to which there is transmitted the measured quantity signal, there is connected the output of a second time multiplexer which is periodically switched between a plurality of inputs to which there are applied a plurality of measured quantity signals, and wherein the switching of the multiplexer is effected at a predetermined beat.

8 Claims, 15 Drawing Figures

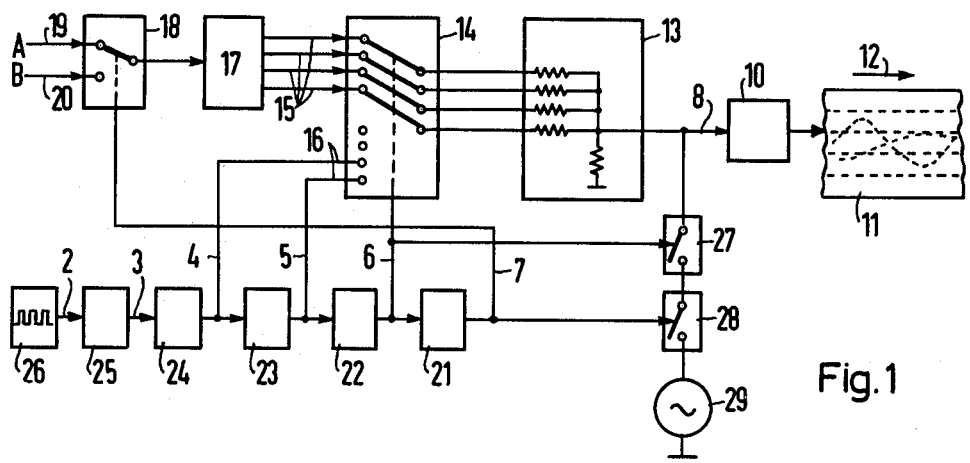
Fig. 2
Fig. 3
Fig. 4
Fig. 5
Fig. 6
Fig. 7
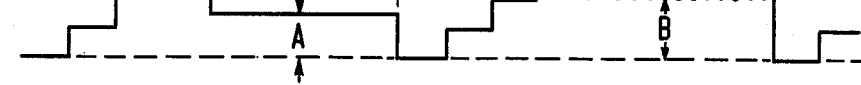
Fig. 8

RECORDING DEVICE FOR PLOTTING THE CURVE OF AT LEAST ONE MEASURED QUANTITY

FIELD OF THE INVENTION

The present invention relates to a recording device for plotting the curve of at least one measured quantity which is reproduced through an electrical signal, including a recorder, a recording or graph carrier, and means for producing relative movement between the recorder and the recording carrier into two directions extending approximately perpendicularly to each other.

DISCUSSION OF THE PRIOR ART

A known recording device of the type of the present invention is suited, for example, for the recording of a curve pattern which represents the plot of a measured quantity. In order to evaluate a recorded curve it is necessary to utilize reference values for comparative purposes. These reference values may be imprinted on the employed plot carrier, meaning that the recording or graph carrier may be provided with preprinted scales and reference lines. A disadvantage encountered therein lies in that the recording carrier must be precisely fitted into the recording system with the preprinted scales and reference lines so as to allow for an evaluation of the recorded curve pattern by means of a comparison with the reference lines and scales. It is further disadvantageous in that non-linearities of the recording system may lead to reading errors when the recorded curve is compared with the preprinted reference lines. Furthermore, read-off errors are occasioned by the reference line displacement and intensifying drift of the recording system.

SUMMARY OF THE INVENTION

Accordingly, it is an object of the present invention to provide a recording device of the above-mentioned type, in which read-off errors will not occur as a result of an incorrect position of the plotted curve with regard to the associated reference lines or scales, or due to non-linearities or the reference line displacement and intensifying drift of the recording system.

The foregoing object is inventively attained through the provision of a time multiplexer which alternatingly periodically connects the control input of the recording device to a generator for a reference line signal and to at least one generator for a measured quantity signal.

In the inventive recording device, the reference lines themselves are recorded by means of the recording device, so that non-linearities of the recording system will not lead to read-off errors. Furthermore, the reference line and intensifying drift of the recording system is automatically balanced. Consequently, a precise fitting in of the recording carrier into the recording system is no longer required, since the reference lines are recorded in correct association with the plotted curve.

In a suitable construction of the invention, it is proposed that to the particular input of the multiplexer to which there is transmitted the measured quantity signal, there is connected the output of a second time multiplexer which is periodically switched between a plurality of inputs to which there are applied a plurality of measured quantity signals, and wherein the switching of the multiplexer is effected at a predetermined beat. In this construction, in addition to the reference lines, there are recorded at least two measured quantities. For distinguishing amongst a plurality of recorded curves, it is contemplated that there be provided a high-frequency generator which superimposes on at least one of the measured quantity signals, therewith contrastingly high-frequency oscillations of low amplitude. The high-frequency generator may be connected to the output of the first multiplexer and periodically switched in by means of signals which are tapped-off at an interruptor stage. Furthermore, means may be provided which effect a timewise differingly long connection of the measured quantity signals to the recorder.

BRIEF DESCRIPTION OF THE DRAWINGS

Further advantageous embodiments and construction of the invention may now be ascertained from the following detailed description of an exemplary embodiment thereof, taken in conjunction with the accompanying drawings; in which:

FIG. 1 diagrammatically illustrates a recording device for digital signals constructed pursuant to the present invention;

FIGS. 2 through 8 graphically illustrate the voltage plot at various locations of the recording device of FIG. 1;

DETAILED DESCRIPTION

Figure 9:
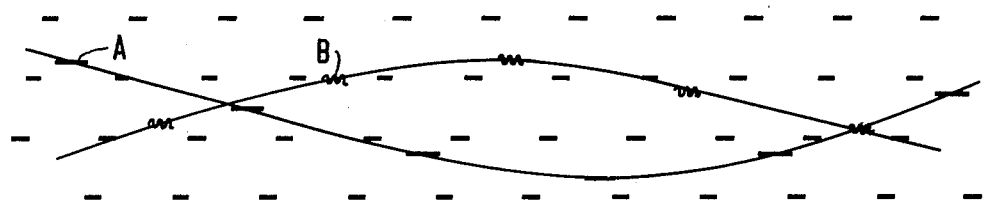
FIG. 9 is an illustration of a recorded curve plot produced by means of the recording device of FIG. 1.

Illustrated in FIG. 1 is a recorder 10 which is adapted to form plots or drawings on a graph or recording carrier or tape 11. The recorder 10, for example, may include a nozzle which directs a fine, sharp ink jet against the recording carrier 11.

The recording carrier 11 is conveyed in the direction of arrow 12 during recordation. The recorder 10 is controllable by means of a voltage applied to its input 8, which is delivered by a digital-analog transducer 13. The digital-analog transducer 13 includes four inputs to which there is applied a four-position binary signal which represents the information which is to be presently recorded. The four inputs of the digital analog transducers 13 are connected to the output of a multiplexer 14, the latter of which includes four inputs 15 for measured quantity signals and two inputs 16 for reference line signals. The inputs 15 lead to an analog-digital tranducer 17 which has its input connected to the output of a second multiplexer 18, the latter of which alternatingly connects two conductors 19 and 20 to the input of the analog-digital transducer 17. Electrical signals A and B are applied to the two connectors 19 and 20, which in an analog manner characterize the timewise plot of two measured quantities.

The control of the multiplexers 14 and 18 is carried out by means of a series or chain of interrupter stages 21 through 25 which are supplied by a pulse generator 26. The pulse generator 26 delivers a square-wave impulse series. The voltages in the interruptor stages 21 through 25 are illustrated in FIGS. 2 through 7. The voltage at the location 2 hereby is shown by FIG. 2, the voltage at location 3 by FIG. 3, and so forth.

Connected to the output of the digital-analog transducer 13, and thereby to the input of the recoder 10, are two switches 27 and 28 which are controlled by the output voltages of the interrupter stages 21 and 22, and which allow a high-frequency generator 29 to be connected to the input of the recorder 10.

From FIG. 8, which shows the voltage at the input of the recorder 10 in a considerably time-distorted illustration, there may be ascertained that the control of the multiplexers 14 and 18 is carried out by means of the voltages at the outputs of the interrupter stages 21 through 24, in such a manner, whereby the recorder initially receives a step-shaped analog signal which effects the recording of four short parallel lines or dashes on the recording carrier 12, which are associated with four reference lines.

Subsequently, a short line is recorded in the illustrated position of the multiplexers 14 and 18, which characterizes the instantaneous value of the measured quantity signal A. After the recording of this line, the multiplexer 14 is again switched over so that once again there are recorded four lines which are associated with the reference lines. After completing this recording, the multiplexer 14 is switched back into the illustrated position, however, the multiplexer 18 is switched back to the conductor 20 since the voltage, pursuant to FIG. 7, is now positive, so that there is now recorded the signal B. Inasmuch as, during the recording of signal B, the two switches 27 and 28 are always closed (positive output voltages of the stages 21 and 22) there is superimposed on the lines of the signal B a high-frequency oscillation having a lower amplitude in contrast with the signal amplitude, so that the signal B may be clearly distinguished from the signal A on the recording carrier.

From FIG. 9 there may be ascertained the recording of a curve plot. Four short lines are always recorded which characterize four reference lines, subsequently the signal A, then again four short reference lines, and then the signal B with the superimposed high-frequency oscillation, then again four reference lines, then again the signal A, and so forth. From FIGS. 1 through 8 there may be clearly ascertained that this series sequence is assured by means of the selective connection of the outputs of the interrupter stages 21 through 24 to the multiplexers 14 and 18 and to the switches 27 and 28.

In the illustrated exemplary embodiment, the code in which the measured quantity signals A and B are applied to the inputs of the multiplexer 14, are equal to the code at the input 16 which characterizes the reference lines, so that by means of a simple switching over of the output of the multiplexer 14 to the inputs 15 and 16, it becomes possible to provide an alternate recording of reference lines and measured quantity signals in connection with a single digital-analog transducer 13. In the exemplary embodiment, for purposes of simplicity, the measured quantity signals A and B are converted into a 4-bit binary code, and the reference lines are produced in a 2-bit binary code.

Within the scope of the invention, in lieu of the superposition onto the recording of a measured quantity signal of a high frequency oscillation, there may also be selected from the recording of the other measured quantities the different length of the individual lines so that, in this manner, there is also possible an easy distinction between the two recordings A and B. This may be attained in that the measured quantity signals are connected differently long to the recorder 10 so that, for example, the measured quantity signal B is connected to the recorder 10 always somewhat longer than the measured quantity signal A, whereby its individual lines are somewhat longer than the individual lines of the measured quantity signal A.

Non-linearities or reference line and intensifying drifts of the recorder 10 do not influence the relationship between the recorded reference lines and the recorded measured quantities. Furthermore, a precise insertion of the recording carrier 11 into the recording system is no longer required since this insertion will also exert no influence over the relationship between the recorded reference lines and the recorded measured quantities.

Figure 10:
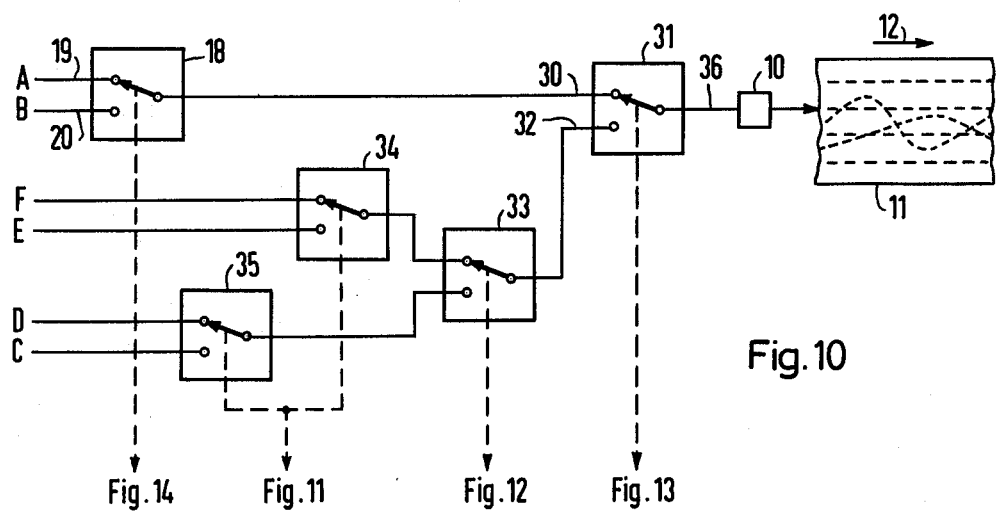
FIG. 10 illustrates a recording device for analogous signals constructed pursuant to the present invention.
Figure 11:
FIGS. 11 through 15 illustrate pulse curves for elucidating the recording device of FIG. 10.
Figure 12:
Figure 13:
Figure 14:
Figure 15:
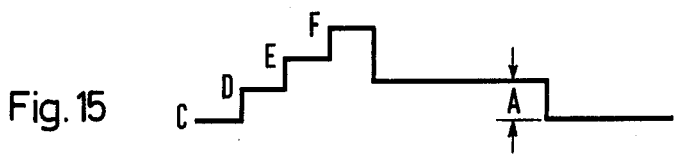

In the embodiment according to FIG. 10, components which are the same as those in FIG. 1 are designated by the same reference numerals. The two measured quantity signals A and B hereby, as in the example pursuant to FIG. 1, are provided in an analog form, however, are transmitted through the time multiplexer 18 to the input 30 of a time multiplexer 31 in an analog form. A second input 32 of the time multiplexer 31 is connected to the output of a time multiplexer 33 whose two inputs lead to the outputs of two time multiplexers 34 and 35. Located at the inputs C through F of the multiplexers 34 and 35 are four reference lines signals in analog form, meaning, at input C there is located the lowest signal, at input D the next higher signal, at input E a signal elevated a further step with reference to the signal at input D, and at input F the highest reference line signal.

The FIGS. 11 through 15 indicate the beat at which the multiplexers 18 and 31 through 35 are actuated. The multiplexers 18 and 31 through 35 may be controlled by means of a chain or series of interrupter stages, as is illustrated in FIG. 1. The two multiplexers 34 and 35 are hereby commonly actuated in conformance with the pulse or beat shown in FIG. 11, the multiplexer 33 pursuant to FIG. 12, the multiplexer 31 pursuant to FIG. 13, and the multiplexer 18 pursuant to FIG. 14. When it is assumed that a zero potential is at the input C, and that the signal at input D distinguishes from the zero potential by one stage, at input E by two stages, and at input F by three stages, then at the output 36 of the multiplexer 31 there is obtained a voltage plot pursuant to FIG. 15. From FIG. 15 there may be clerly ascertained that, for example, the voltage at output 36, which is recorded on the recording carrier 11, extends through four stages, that in effect four reference lines are recorded in the form of dashes, and that there is then recorded the measured quantity signal A. Here again there will connect itself, as also shown in FIG. 8, the recording of the four analog reference line signals. The recording of the measured quantity signal B now follows, and so forth. The recording on the recording carrier 11 corresponds thus to the recording in FIG. 9.

The representation according to FIG. 9 is greatly timewise distorted. In actual practice, the signal sequence is so determined with respect to the conveyance of the recording carrier 11, that the plots A and B and the reference lines may be clearly recognized.

While there has been shown what is considered to be the preferred embodiment of the invention, it will be obvious that modifications may be made which come within the scope of the disclosure of the specification.

What is claimed is:

1. In a recording device for plotting the curve of at least one measured quantity produced by an electrical signal, including a recorder; a recording carrier adapted to have indicia plotted thereon by said recorder; and means for producing relative movement between said recorder and recording carrier in two approximately perpendicular directions, the improvement comprising: a generator for a reference line signal; at least one generator for a measured quantity signal; a time multiplexer for alternately periodically connected a control input of said recording device to said reference line signal generator and to said measured quantity signal generator in successive recording positions of the recording carrier relative to the recorder with respect to a given direction of relative movement, said recorder comprising an ink jet operable to record indicia on the recording carrier over a range of transverse positions successively offset in a transverse direction transverse to said given direction of relative movement and the successive recorded indicia being displaced in said transverse direction in accordance with the successive instantaneous input signal magnitudes supplied to the control input of said recording device, said reference line signal generator being operable in each cycle of operation thereof for sequentially generating a set of different discrete reference signal magnitudes representing respective different discrete reference levels and corresponding to successively greater displacements of the indicia in said transverse direction, and means controlling said reference line signal generator to sequentially generate the successive discrete reference signal magnitudes in each of a succession of cycles of operation thereof, and controlling said time multiplexer to alternately supply successive ones of the discrete reference signal magnitudes occurring during a given cycle and successive instantaneous values of the measured quantity signal to said control input of said recording device whereby indicia are recorded on the recording carrier alternately according to successive different discrete reference signal magnitudes and according to successive instantaneous values of the measured quantity signal so that a plurality of sets of reference line indicia are plotted in a sequence of first nonadjacent recording positions along the recording carrier in said given direction of relative movement and successive measured quantity indicia are plotted on said recording carrier in a sequence of second nonadjacent recording positions interleaved with respect to said given direction relative to said first nonadjacent recording positions, thus to define a plurality of parallel reference lines which are recognizable along the extent of plot of the measured quantity indicia supplied by said measured quantity signal generator.

2. A recording device as claimed in claim 1, comprising a second time multiplexer having an output connected to the input of the first multiplexer receiving the measured quantity signal, said second multiplexer being periodically switched among a plurality of inputs at which there are applied a plurality of measured quantity signals; and means for effecting the switching of said multiplexer in a predetermined pulse beat.

3. A recording device as claimed in claim 2, said measured quantity signals being all presented in digital code; and a digital-analog transducer receiving said digital code alternately with a generated digital code for the reference lines through said time multiplexers, said transducer having an output for controlling said recorder.

4. A recording device as claimed in claim 2, comprising a high-frequency generator for superimposing a high-frequency oscillation on at least one said measured quantity signal of a lower amplitude in contrast therewith.

5. A recording device as claimed in claim 2, comprising means for effecting a timewise differing connection of said measured quantity signals to said recoder.

6. In a recording device for plotting the curve of at least one measured quantity produced by an electrical signal, including a recorder; a recording carrier adapted to have indicia plotted thereon by said recorder; and means for producing relative movement between said recorder and recording carrier in two approximately perpendicular directions, the improvement comprising: a generator for a reference line signal; at least one generator for a measured quantity signal; and a time multiplexer for alternately periodically connected a control input of said recording device to said reference line signal generator and to said measured quantity signal generator; a second time multiplexer having an output connected to the input of the first multiplexer receiving the measured quantity signal, said second multiplexer being periodically switched among a plurality of inputs at which there are applied a plurality of measured quantity signals; and means for effecting the switching of said multiplexer in a predetermined pulse beat, said measured quantity signals being all presented in digital code; and a digital-analog transducer receiving said digital code alternatively with a generated digital code for the reference lines through said time multiplexers, said transducer having an output for controlling said recorder; said reference line signal generator comprising a series of interrupter stages; and a square-wave impulse generator connected to said interrupter stages, said stages having a tap so that said reference line signal is tapped off at said stages.

7. A recording device as claimed in claim 6, including means on said interrupter stages for tapping off the switching signals for said multiplexers.

8. In a recording device for plotting the curve of at least one measured quantity produced by an electrical signal, including a recorder; a recording carrier adapted to have indicia plotted thereon by said recorder; and means for producing relative to movement between said recorder and recording carrier in two approximately perpendicular directions, the improvement comprising: a generator for a refernce line signal; at least one generator for a measured quantity signal; and a time multiplexer for alternately periodically connecting a control input of said recording device to said reference line signal generator and to said measured quantity signal generator; a second time multiplexer having an output connected to the input of the first multiplexer receiving the measured quantity signal, said second multiplexer being periodically switched among a plurality of inputs at which there are applied a plurality of measured quantity signals; and means for effecting the switching of said multiplexer in a predetermined pulse beat; a high-frequency generator for superimposing a high-frequency oscillation on at least one said measured quantity signal of a lower amplitude in contrast therewith; said high-frequency generator being connected to the output of said first multiplexer, means for tapping off the signal from one said interruper stage, and means for switching in the signal periodically through said generator.

* * * * *